(12) United States Patent  (10) Patent No.: US 8,890,322 B2
Igarashi  (45) Date of Patent: Nov. 18, 2014

(54) SEMICONDUCTOR APPARATUS AND METHOD OF MANUFACTURING SEMICONDUCTOR APPARATUS

(75) Inventor: Takatoshi Igarashi, Nagano (JP)

(73) Assignee: Olympus Corporation, Tokyo (JP)

( * ) Notice: Subject to any disclaimer, the term of this patent is extended or adjusted under 35 U.S.C. 154(b) by 127 days.

(21) Appl. No.: 12/714,849

(22) Filed: Mar. 1, 2010

(65) Prior Publication Data

US 2010/0225004 A1  Sep. 9, 2010

(30) Foreign Application Priority Data

Mar. 3, 2009 (JP) .................................. 2009-049664

(51) Int. Cl.
*H01L 23/488* (2006.01)
*H01L 23/48* (2006.01)
*H01L 21/768* (2006.01)
*H01L 21/60* (2006.01)
*H01L 23/00* (2006.01)

(52) U.S. Cl.
CPC . *H01L 21/76898* (2013.01); *H01L 2924/01019* (2013.01); *H01L 23/481* (2013.01); *H01L 24/12* (2013.01)
USPC ................... 257/774; 257/737; 257/E21.585; 257/E21.506; 257/E23.011; 257/E23.023; 438/637; 438/613

(58) Field of Classification Search
USPC ........... 257/713, 773, 774, E23.011; 438/667
See application file for complete search history.

(56) References Cited

U.S. PATENT DOCUMENTS

| 6,821,655 | B1 * | 11/2004 | Ohta et al. ..................... 428/701 |
| 7,482,738 | B2 * | 1/2009 | Taniguchi et al. ............ 310/371 |
| 2002/0030283 | A1 * | 3/2002 | Itabashi et al. ................ 257/774 |
| 2009/0189276 | A1 * | 7/2009 | Sano et al. ..................... 257/713 |
| 2009/0200679 | A1 * | 8/2009 | Harada et al. ................. 257/773 |
| 2009/0236583 | A1 * | 9/2009 | Kuo et al. ......................... 257/4 |
| 2009/0294987 | A1 * | 12/2009 | Yamada et al. ............... 257/774 |
| 2010/0007030 | A1 * | 1/2010 | Koike et al. ................... 257/774 |
| 2010/0190338 | A1 * | 7/2010 | Koike et al. ................... 438/667 |
| 2010/0258944 | A1 * | 10/2010 | Uchiyama et al. ............ 257/773 |
| 2011/0102657 | A1 * | 5/2011 | Takahashi et al. ............ 348/308 |

FOREIGN PATENT DOCUMENTS

| JP | 10315461 A | * 12/1998 | .............. B41J 2/045 |
| JP | 2005-101268 | 4/2005 | |
| JP | 2007-12854 A | 1/2007 | |
| JP | 2008-218831 | 9/2008 | |
| JP | 2009-21433 A | 1/2009 | |
| WO | 2008/035270 A2 | 3/2008 | |

* cited by examiner

*Primary Examiner* — Lex Malsawma
*Assistant Examiner* — Sheng Zhu
(74) *Attorney, Agent, or Firm* — Scully, Scott, Murphy & Presser, P.C.

(57) ABSTRACT

A semiconductor apparatus including a semiconductor substrate having a first principal surface on which an electric circuit is formed and a second principal surface opposed to the first principal surface, and a through hole that penetrates the first principal surface and the second principal surface, a multilayered wiring layer having a plurality of conductive wiring layers connected to the electric circuit and a plurality of inter-layer insulating layers having an insulating layer opening of a same size and at a same position as a through hole opening which is an opening of the first principal surface of the through hole, an electrode pad that covers the insulating layer opening connected to the conductive wiring layer and a lead-out wiring layer having a through wiring layer connected to the electrode pad formed inside the through hole and a connection wiring layer formed integral with the through wiring layer.

10 Claims, 5 Drawing Sheets

SEMICONDUCTOR APPARATUS AND METHOD OF MANUFACTURING SEMICONDUCTOR APPARATUS

CROSS REFERENCE TO RELATED APPLICATION

This application claims the benefit of Japanese Application No. 2009-049664 filed in Japan on Mar. 3, 2009, the contents of which are incorporated herein by this reference.

BACKGROUND OF THE INVENTION

1. Field of the Invention

The present invention relates to a semiconductor apparatus having through wiring that penetrates a semiconductor substrate and a method of manufacturing the semiconductor apparatus.

2. Description of the Related Art

In recent years, there is a growing demand for downsizing and a thickness reduction of semiconductor apparatuses. Thus, chip size package (CSP) type and stacked multi-chip package (MCP) type semiconductor apparatuses having through wiring that penetrates a semiconductor substrate have been developed. That is, such an apparatus is a semiconductor apparatus in which an electrode pad on the surface of the semiconductor substrate on which an electric circuit such as a device is formed is electrically connected to the other surface side via wiring that penetrates the substrate. For example, Japanese Patent Application Laid-Open Publication No. 2005-101268 discloses a semiconductor apparatus in which an electrode pad of a device formed on the surface side is electrically connected to a bump which is an input/output terminal for signals or the like on the rear side via through wiring.

Furthermore, the present applicant discloses a semiconductor apparatus having a taper-shaped through hole using an anisotropic etching method in Japanese Patent Application Laid-Open Publication No. 2008-218831.

However, the wiring from the electric circuit to the electrode pad is complexly wired in multilayers and when an electrode pad is formed of a topmost wiring layer of the multilayered wiring layer, the total thickness of inter-layer insulating layers interposed between the electrode pad and the semiconductor substrate increases.

SUMMARY OF THE INVENTION

According to an aspect of the present invention, a semiconductor apparatus is provided which includes a semiconductor substrate having a first principal surface on which an electric circuit is formed and a second principal surface opposed to the first principal surface, and a through hole that penetrates the first principal surface and the second principal surface, a multilayered wiring layer formed on the first principal surface having a plurality of conductive wiring layers connected to the electric circuit and a plurality of inter-layer insulating layers having an insulating layer opening of a same size and at a same position as a through hole opening which is an opening of the first principal surface of the through hole, an electrode pad that covers the insulating layer opening connected to the conductive wiring layer and a lead-out wiring layer having a through wiring layer connected to the electrode pad formed inside the through hole and a connection wiring layer formed on the second principal surface side integral with the through wiring layer.

Furthermore, according to another aspect of the present invention, a method of manufacturing a semiconductor apparatus is provided which includes a device substrate preparation step of preparing a device substrate including a semiconductor substrate having a first principal surface on which an electric circuit is formed and a second principal surface opposed to the first principal surface, a multilayered wiring layer on the first principal surface having a plurality of conductive wiring layers connected to the electric circuit and a plurality of inter-layer insulating layers and electrode pads on the inter-layer insulating layers connected to the conductive wiring layers, a through hole formation step of etching the semiconductor substrate from the second principal surface side and forming a through hole having a smaller through hole opening than the electrode pad at a position opposed to the electrode pad and an inter-layer insulating layer etching step of etching the inter-layer insulating layers from the second principal surface side using the semiconductor substrate in which the through hole is formed as an etch mask and forming an insulating layer opening at a same position as the through hole opening.

DETAILED DESCRIPTION OF THE PREFERRED EMBODIMENTS

First Embodiment

Figure 1:
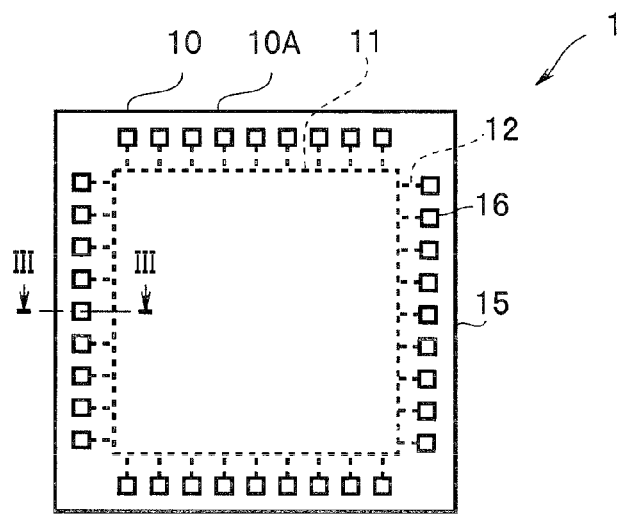
FIG. 1 is a plan view of a semiconductor apparatus according to a first embodiment observed from a first principal surface side.
Figure 2:
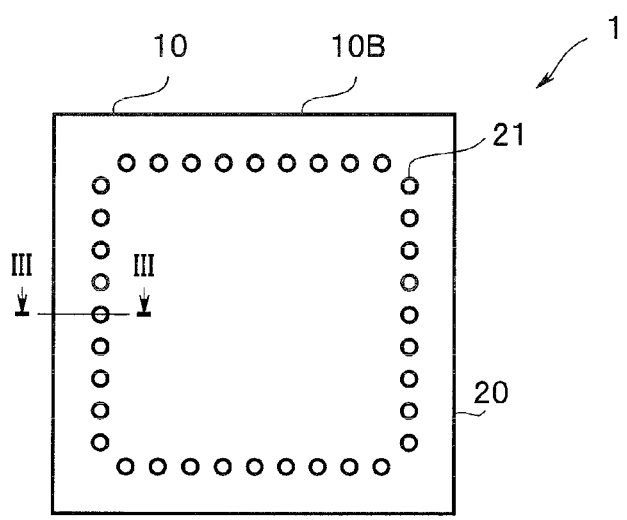
FIG. 2 is a plan view of the semiconductor apparatus according to the first embodiment observed from a second principal surface side.
Figure 3:
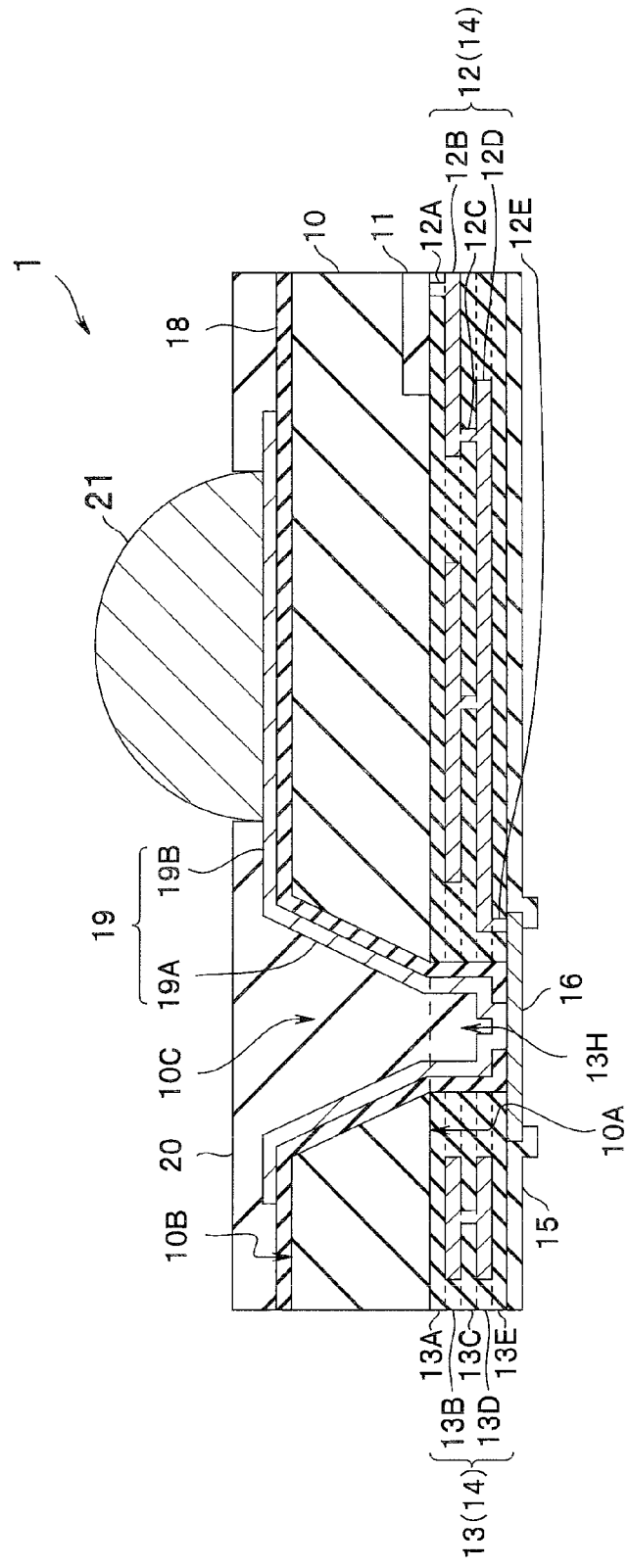
FIG. 3 is a schematic view illustrating a cross-sectional structure of the semiconductor apparatus according to the first embodiment.

Hereinafter, a first embodiment of the present invention will be explained with reference to the accompanying drawings. FIG. 1 is a plan view of a semiconductor apparatus according to the first embodiment observed from a first principal surface side, FIG. 2 is a plan view of the semiconductor apparatus according to the first embodiment observed from a second principal surface side and FIG. 3 is a schematic view illustrating a cross-sectional structure of the semiconductor apparatus according to the first embodiment.

As shown in FIG. 1, a semiconductor apparatus 1 of the present embodiment has a substantially rectangular semiconductor substrate 10 and a device having an electric circuit 11 such as semiconductor device, optical device or micromachine is formed on a first principal surface 10A of the semiconductor substrate 10. A plurality of electrode pads 16 for input/output signals electrically connected to the electric circuit 11 of the device via a conductive wiring layer 12 are formed along the edges of the semiconductor substrate 10.

The electrode pad 16 is made up of a conductive layer of aluminum or the like and is formed above an inter-layer insulating layer 13 that insulates the conductive wiring layer 12 formed on the first principal surface 10A of the semiconductor substrate 10. Moreover, a protective film 15 made of an insulating film such as a silicon oxide film is formed above the electrode pad 16 and an opening to expose part of the electrode pad 16 to outside is formed in the protective film 15.

Though displayed in a simplified manner in FIG. 1, the conductive wiring layer 12 is a multilayered wiring layer in which a plurality of conductors are three-dimensionally wired via the plurality of inter-layer insulating layers 13.

As shown in FIG. 2, a plurality of bumps 21 each connected to the electrode pad 16 are formed on a second principal surface 10B of the semiconductor substrate 10. That is, as will be described later, the electrode pad 16 and the bump 21 are electrically connected together via a through wiring layer 19A (see FIG. 3) and a connection wiring layer 19B (FIG. 3). Furthermore, the second principal surface 10B of the semiconductor substrate 10 is covered with a protective film 20 having bump openings in the regions of the bumps 21.

The semiconductor apparatus 1 having the bumps 21 on the second principal surface 10B can be directly mounted on various apparatuses without using wire bonding or the like.

Next, the through wiring structure of the semiconductor apparatus 1 according to the present embodiment will be described using FIG. 3. FIG. 3 is a partial cross-sectional view along a line III-III in FIG. 1 or FIG. 2. To facilitate illustration, FIG. 3 is a schematic view in which layer thickness ratios or the like among different layers are different from the actual ratios.

As shown in FIG. 3, the semiconductor substrate 10 is a flat plate having the first principal surface 10A on which the electric circuit 11 is formed and the second principal surface 10B opposed to the first principal surface 10A. A through hole 10C that penetrates the first principal surface 10A and the second principal surface 10B is formed in the semiconductor substrate 10.

A multilayered wiring layer 14 of the first principal surface 10A has a plurality of conductive wiring layers 12A to 12E and a plurality of inter-layer insulating layers 13A to 13E. The whole of the plurality of conductive wiring layers 12A to 12E is referred to as "conductive wiring layer 12" or the like with the last alphabetic character deleted. The conductive wiring layer 12 connects the electric circuit 11 and the electrode pad 16. The inter-layer insulating layer 13 includes an insulating layer opening 13H of the same size and at the same position as the through hole opening which is an opening of the first principal surface 10A of the through hole 10C. The electrode pad 16 covers the insulating layer opening. That is, the whole of the insulating layer opening is covered so that no part thereof is exposed. The bump 21 is then formed on top of a lead-out wiring layer 19 made up of a through wiring layer 19A connected to the second principal surface 10B side of the electrode pad 16 and a connection wiring layer 19B formed integral with the through wiring layer 19A.

In the semiconductor apparatus 1 according to the present embodiment, the insulating layer opening has the same size as the through hole opening, in other words, there is no difference in level in a portion where the through hole opening contacts the insulating layer opening, which may cause problems such as wire breakage of the through wiring layer. For this reason, wire breakage hardly occurs in the through wiring layer 19A, and the semiconductor apparatus 1 thereby has high reliability.

Furthermore, the through hole 10C has a taper shape in which the opening of the second principal surface 10B is larger than the through hole opening of the first principal surface 10A. For this reason, wire breakage hardly occurs in the through wiring layer 19A, and the semiconductor apparatus 1 thereby has high reliability.

Next, the method of manufacturing the semiconductor apparatus 1 according to the present embodiment will be described using FIG. 4A to FIG. 5G. FIG. 4A to FIG. 5G are cross-sectional structure schematic views illustrating the same parts as those in FIG. 3 to illustrate the method of manufacturing the semiconductor apparatus of the present embodiment.

Figure 4A:
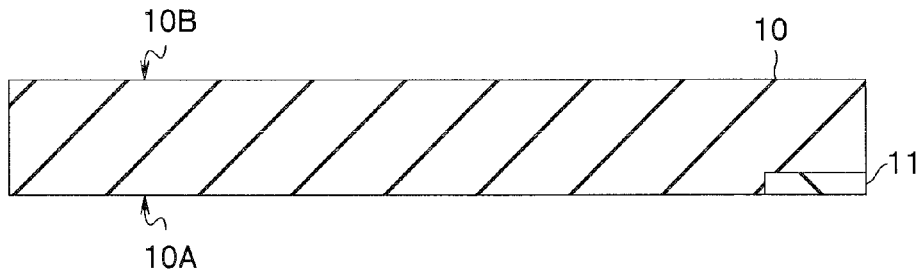
FIG. 4A is a schematic view of a partial cross-sectional structure illustrating a method of manufacturing the semiconductor apparatus according to the first embodiment.
Figure 4B:
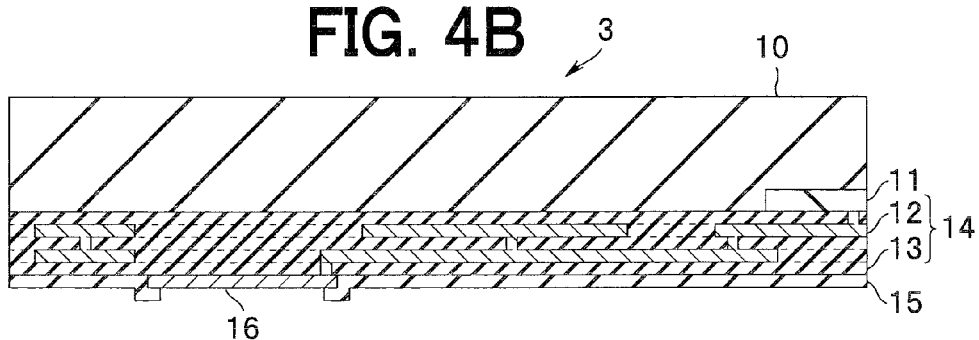
FIG. 4B is a schematic view of a partial cross-sectional structure illustrating the method of manufacturing the semiconductor apparatus according to the first embodiment.

<Device Substrate Preparation Step> FIG. 4A to FIG. 4B

The semiconductor substrate 10 is prepared which is a flat single crystal silicon (100) substrate having the first principal surface 10A on which the electric circuit 11 is formed and the second principal surface 10B opposed to the first principal surface 10A.

Although FIG. 4A shows an example where the electric circuit 11 which is a semiconductor circuit is formed inside the semiconductor substrate 10, the electric circuit 11 or the like may also be formed of a member different from that of the semiconductor substrate 10 on the semiconductor substrate 10.

Next, as shown in FIG. 4B, the multilayered wiring layer 14 is formed on the semiconductor substrate 10. The multilayered wiring layer 14 is formed by sequentially repeating formation of a conductive layer made of aluminum or the like, patterning of the conductive layer, formation of an inter-layer insulating layer made of a silicon oxide film or the like, flattening processing by means of CMP (chemical mechanical polishing), and is a three-dimensional wiring layer made up of the plurality of conductive wiring layers 12 insulated by the plurality of inter-layer insulating layers 13. FIG. 4B illustrates the multilayered wiring layer 14 having a three-layer structure, but the multilayered wiring layer 14 having complicated three-dimensional wiring includes many layers stacked together, and therefore has a large thickness. The film thickness of the multilayered wiring layer 14, that is, the film thickness of the inter-layer insulating layer 13 is greater than 1 μm, for example, 3 μm or more and 50 μm or less. Furthermore, silicon nitride, polyimide or various publicly known low-k materials may be used for the inter-layer insulating layer.

The region of the multilayered wiring layer 14 where the electrode pad 16 is formed is made up of the plurality of inter-layer insulating layers 13 only partially having the conductive wiring layers 12 for electric connections.

The electrode pad 16 made of copper or aluminum or the like is formed on the multilayered wiring layer 14, and further the protective film 15 is formed which is made up of an insulating film such as a silicon oxide film having an opening in the portion of the electrode pad 16. The opening of the portion of the electrode pad 16 of the protective film 15 is intended to be used for evaluation and may not necessarily be formed. Moreover, part of the multilayered wiring layer 14 may be used as the electrode pad 16.

Through the above described steps, a device substrate 3 is prepared which includes the multilayered wiring layer 14 having the plurality of conductive wiring layers 12 connected to the electric circuit 11 and the plurality of inter-layer insulating layers 13, and the electrode pad 16 on the inter-layer insulating layers 13 connected to the conductive wiring layers 12.

As shown in FIG. 4B, the plurality of inter-layer insulating layers 13 insulate between the plurality of conductive wiring layers 12. However, no conductive wiring layer 12 exists in the region in which the through hole 10C is created and the multilayered wiring layer 14 is made up of only the plurality of inter-layer insulating layers 13.

Figure 4C:
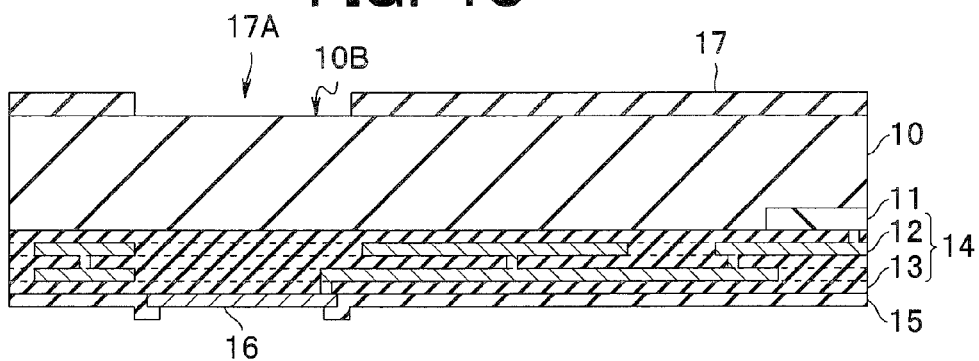
FIG. 4C is a schematic view of a partial cross-sectional structure illustrating the method of manufacturing the semiconductor apparatus according to the first embodiment.
Figure 4D:
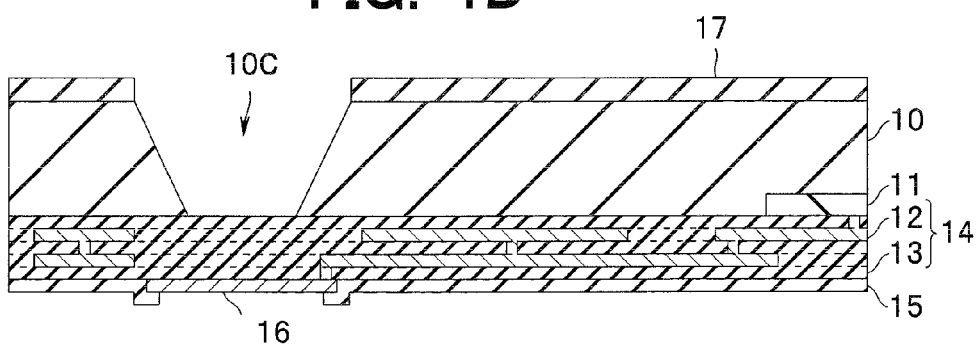
FIG. 4D is a schematic view of a partial cross-sectional structure illustrating the method of manufacturing the semiconductor apparatus according to the first embodiment.

<Through Hole Formation Step> FIG. 4C to FIG. 4D

Next, as shown in FIG. 4C, an etch mask layer 17 having an opening 17A is formed at a position opposed to the electrode pad 16 of the second principal surface 10B. The etch mask layer 17 is formed using a hard mask such as a silicon oxide film or a soft mask such as a photoresist.

As shown in FIG. 4D, the semiconductor substrate 10 is etched from the second principal surface side, and the taper-shaped through hole 10C is formed which has a smaller through hole opening than the electrode pad 16 at the position opposed to the electrode pad 16. Here, the through hole opening is the opening of the through hole 10C in the first principal surface 10A. When single crystal silicon is etched using an etching method having an extremely large etching selection ratio with respect to the inter-layer insulating layer 13, for example, wet etching processing using a TMAH solution, the inter-layer insulating layer 13 is practically not etched, and therefore the inter-layer insulating layer 13 becomes an etching stopping layer. That is, as shown in FIG. 4D, although the through hole 10C penetrates the semiconductor substrate 10, the device substrate 3 is formed as a non-penetrating via hole.

The taper-shaped through hole 10C can be easily formed by using, for example, a single crystal silicon (100) substrate as the semiconductor substrate 10 and carrying out wet etching processing using an alkaline solution of KOH or TMAH or the like because such etching is anisotropic etching whose etching speed in a <100> direction is relatively faster than the etching speed in a <111> direction. In the anisotropic wet etching, the size of the opening 17A of the etch mask layer 17 is set in consideration of the taper shape of the through hole 10C to form a smaller through hole opening than the electrode pad 16.

Furthermore, dry etching processing such as ICP-RIE may also be used to form the taper-shaped through hole 10C, and it is possible to form the taper-shaped through hole 10C having a desired angle of inclination of the wall surface by adjusting the gas flow rate ratio of, for example, $SF_6$ and $C_4F_8$ as appropriate. When anisotropic wet etching is used, the angle of inclination is uniquely defined as 54.7°. By contrast, when dry etching processing is used, a taper-shaped through hole of higher gradient than 54.7° can be formed, and it is thereby possible to handle also a case where the pitch (arrangement interval) of the electrode pad is narrow.

Figure 5D:
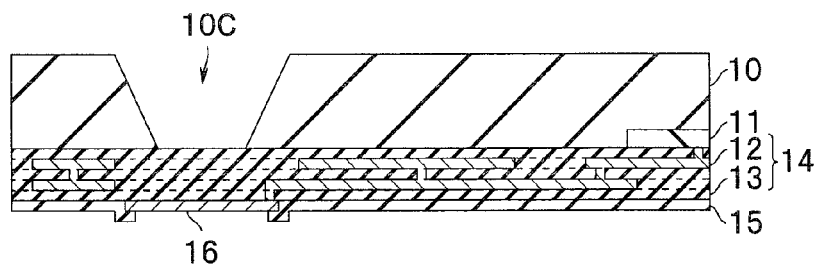
FIG. 5D is a schematic view of a partial cross-sectional structure illustrating the method of manufacturing the semiconductor apparatus according to the first embodiment.
Figure 5E:
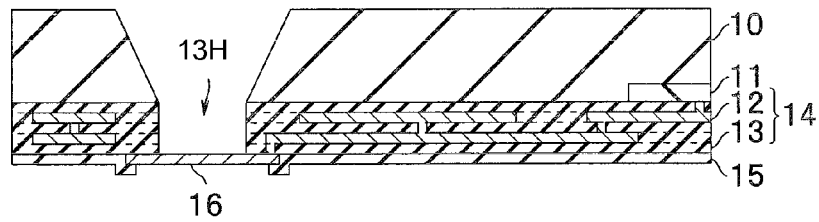
FIG. 5E is a schematic view of a partial cross-sectional structure illustrating the method of manufacturing the semiconductor apparatus according to the first embodiment.

<Inter-Layer Insulating Layer Etching Step> FIG. 5D to FIG. 5E

Next, as shown in FIG. 5D, the etch mask layer 17 is removed after the formation of the through hole 10C. When a silicon oxide film of the same type material as that of the inter-layer insulating layer is used as the etch mask layer 17, the etch mask layer 17 can be removed simultaneously with the etching processing on the inter-layer insulating layer.

As shown in FIG. 5E, using the semiconductor substrate 10 in which the through hole 10C is formed as an etch mask, the inter-layer insulating layer 13 is etched from the second principal surface 10B side and an insulating layer opening is formed in the same size and at the same position as the through hole opening. When, for example, dry etching using a CF-based gas is used, since the inter-layer insulating layer 13 has an extremely large etching selection ratio with respect to the electrode pad 16 and the electrode pad 16 is not practically etched, the electrode pad 16 becomes an etching stopping layer.

That is, according to the method of manufacturing the semiconductor apparatus 1 of the present embodiment, unlike a publicly known method of manufacturing a semiconductor apparatus, no photoresist or semiconductor substrate with an insulating layer formed in the through hole is used as an etch mask.

In the inter-layer insulating layer etching step of the present embodiment, it is possible to form the insulating layer opening of the same size as the through hole opening through anisotropic etching, and etching such as ICP-RIE or the like which is dry etching in particular.

Figure 5F:
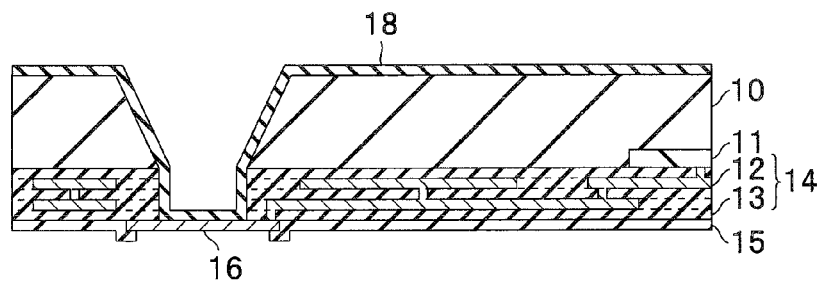
FIG. 5F is a schematic view of a partial cross-sectional structure illustrating the method of manufacturing the semiconductor apparatus according to the first embodiment.

<Second Insulating Layer Formation Step> FIG. 5F

As shown in FIG. 5F, a second insulating layer 18 which is an insulating film of silicon oxide or the like is formed on the inner wall of the through hole 10C and the second principal surface 10B from the second principal surface 10B side.

Figure 5G:
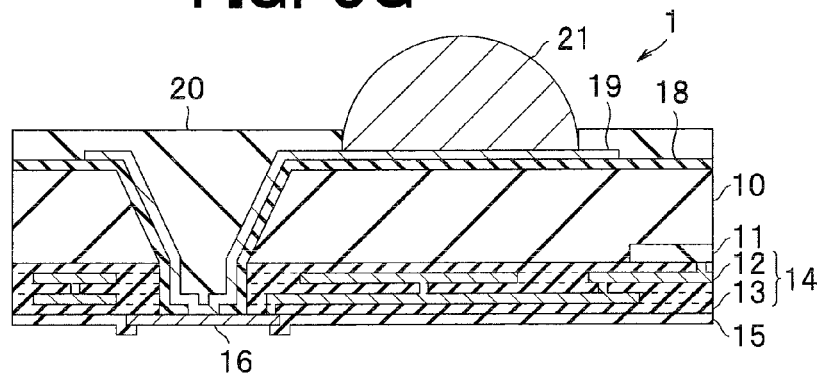
FIG. 5G is a schematic view of a partial cross-sectional structure illustrating the method of manufacturing the semiconductor apparatus according to the first embodiment.

<Lead-Out Wiring Layer Formation Step> FIG. 5G

As shown in FIG. 5G, after removing the second insulating layer 18 on the electrode pad 16, the lead-out wiring layer 19 made of aluminum or copper or the like is formed. For the sake of explanation, the lead-out wiring layer 19 is assumed to have the through wiring layer 19A connected to the electrode pad 16 on the second insulating layer 18 in the through hole 10C and the connection wiring layer 19B connected to the through wiring layer 19A on the second insulating layer 18 of the second principal surface 10B, but the through wiring layer 19A and the connection wiring layer 19B are simultaneously formed into a single piece.

A protective film formation step of covering the second principal surface 10B side with a protective film 20 having a bump opening in the region of the connection wiring layer 19B where the bump 21 is formed and a bump formation step of forming the bump 21 made of copper, solder or the like are performed.

As has already been described, etching of the inter-layer insulating layer 13 having a relatively large thickness exceeding 1 μm requires a long time. However, the method of manufacturing the semiconductor apparatus 1 of the present embodiment uses the semiconductor substrate 10 itself whose quality is hardly altered by etching as the etch mask unlike a photoresist film or semiconductor insulating layer or the like. Thus, the method of manufacturing the semiconductor apparatus 1 of the present embodiment has no adverse influence of photoresist film residues of altered quality. Moreover, no work accuracy deterioration or the like is caused by a reduction of the film thickness of the semiconductor insulating layer formed in the through hole of the silicon substrate. Thus, a highly reliable semiconductor apparatus can be manufactured using the method of manufacturing the semiconductor apparatus 1 of the present embodiment. The method of manufacturing the semiconductor apparatus 1 of the present embodiment has an outstanding effect when the thickness of the inter-layer insulating layer 13 exceeds 1 μm and has a more outstanding effect when the thickness of the inter-layer insulating layer 13 is 3 μm or more and 50 μm or less.

Furthermore, the method of manufacturing the semiconductor apparatus 1 of the present embodiment forms the through hole 10C in which the insulating layer opening has the same size as the through hole opening. In other words, there is no difference in level in a portion where the through hole opening contacts the insulating layer opening, which may cause problems such as wire breakage of the through wiring layer 19A. For this reason, wire breakage hardly occurs in the through wiring layer 19A, and the semiconductor apparatus 1 manufactured using the method of manufacturing the semiconductor apparatus of the present embodiment thereby has high yield and further high reliability.

Furthermore, since the through hole 10C is formed which has a taper shape in which the opening of the second principal surface 10B is larger than the through hole opening of the first principal surface 10A, wire breakage hardly occurs in the through wiring layer 19A, and the semiconductor apparatus 1 manufactured using the method of manufacturing the semiconductor apparatus of the present embodiment thereby has high reliability.

Second Embodiment

Hereinafter, a semiconductor apparatus 2 and a method of manufacturing the semiconductor apparatus 2 according to a second embodiment of the present invention will be explained using the accompanying drawings. Since the semiconductor apparatus 2 and the method of manufacturing the semiconductor apparatus 2 according to the second embodiment are similar to the semiconductor apparatus 1 and the method of manufacturing the semiconductor apparatus 1 according to the first embodiment, the same components will be assigned the same reference numerals and descriptions thereof will be omitted.

FIG. 6D to FIG. 6G are partial cross-sectional structure schematic views for illustrating the method of manufacturing the semiconductor apparatus according to the second embodiment.

Figure 6D:
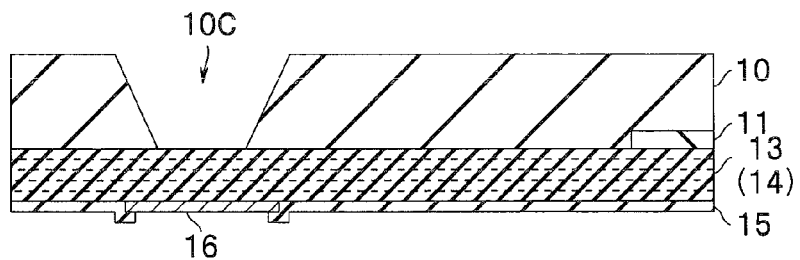
FIG. 6D is a schematic view of a partial cross-sectional structure illustrating a method of manufacturing a semiconductor apparatus according to a second embodiment.
Figure 6E:
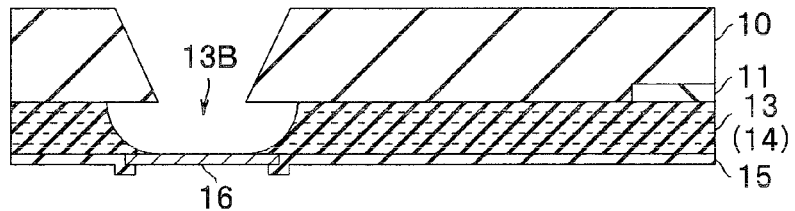
FIG. 6E is a schematic view of a partial cross-sectional structure illustrating the method of manufacturing the semiconductor apparatus according to the second embodiment.

As shown in FIG. 6D, the method of manufacturing the semiconductor apparatus 2 according to the second embodiment is the same as the method of manufacturing the semiconductor apparatus 1 up to the through hole formation step.
<Inter-Layer Insulating Layer Etching Step> FIG. 6E

As shown in FIG. 6E, according to the method of manufacturing the semiconductor apparatus 2, etching in the inter-layer insulating layer etching step is isotropic etching. Unlike anisotropic etching using ICP-RIE or the like, isotropic etching produces no damage caused by plasma, can be performed using low-cost wet etching, has a higher etching speed than ICP-RIE, can be performed using dry etching with a low-cost apparatus, and therefore the method of manufacturing the semiconductor apparatus 2 demonstrates high productivity.

Figure 6F:
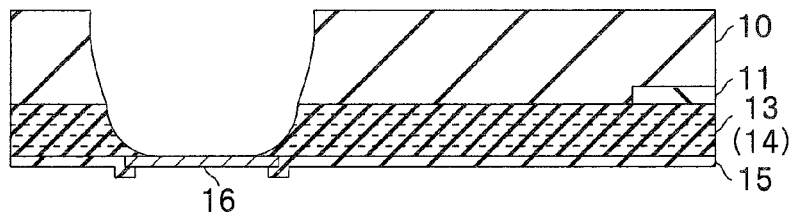
FIG. 6F is a schematic view of a partial cross-sectional structure illustrating the method of manufacturing the semiconductor apparatus according to the second embodiment.

However, since the inter-layer insulating layer 13 has a large thickness, when isotropic etching is performed, the inter-layer insulating layer 13 in the vicinity of the through hole opening of the through hole 13B of the semiconductor substrate 10 is side-etched, and a difference in level caused by an overhang portion of the semiconductor substrate 10 is formed in a portion where the through hole opening contacts the insulating layer opening.
<Through Hole Expansion Step> FIG. 6F

As shown in FIG. 6F, the overhang portion is removed from the semiconductor substrate 10 through etch back processing, the through hole opening of the portion where the through hole opening contacts the insulating layer opening has the same size as that of the insulating layer opening. The etch back processing is processing of removing a non-metal material from the side wall of the hole using a chemical method while adjusting the depth of the material to a predetermined depth. The etch back processing can be performed by wet etching which is isotropic etching or by dry etching whose etching speed is fast and whose apparatus cost is low.
<Lead-Out Wiring Layer Formation Step> FIG. 6G

Figure 6G:
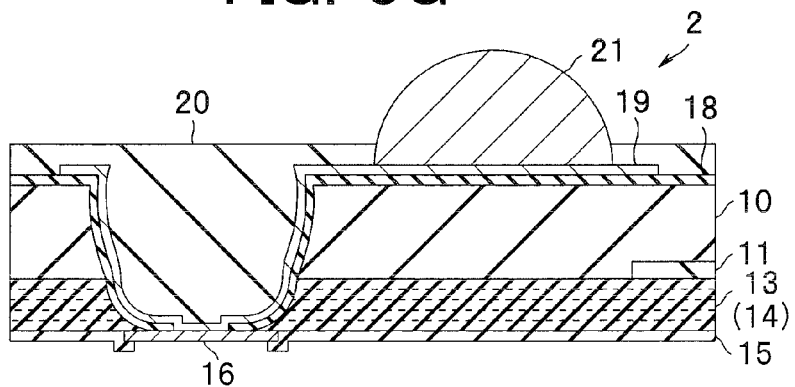
FIG. 6G is a schematic view of a partial cross-sectional structure illustrating the method of manufacturing the semiconductor apparatus according to the second embodiment.

As shown in FIG. 6G, the lead-out wiring layer formation step, protective film formation step and bump formation step are the same as those of the method of manufacturing the semiconductor apparatus 1.

The semiconductor apparatus 2 of the present embodiment has effects similar to those of the semiconductor apparatus 1. The method of manufacturing the semiconductor apparatus 2 of the present embodiment has effects similar to those of the method of manufacturing the semiconductor apparatus 1 and further has an effect of high productivity.

As described so far, according to the present invention, wiring from the electric circuit to the electrode pad is complexly wired in multilayers, and when the electrode pad is formed of the top wiring layer of the multilayered wiring layer and the total thickness of the inter-layer insulating layers interposed between the electrode pad and the semiconductor substrate is large, even if a through hole is formed in the semiconductor substrate and further an opening is also formed in the inter-layer insulating layer, no difference in level is produced in the portion where the through hole opening contacts the insulating layer opening of the inter-layer insulating layer, which may cause problems such as wire breakage of the through wiring layer.

Furthermore, although removing the thick inter-layer insulating layer by etching and forming an opening requires a long time, the photoresist, which is an etch mask, never has quality alteration which is not easily removed. On the other hand, unlike the case where a through hole is etched after formation of a semiconductor insulating layer inside the through hole of the semiconductor substrate, or more precisely, the inter-layer insulating layer is etched using the semiconductor insulating layer as an etch mask, no work accuracy deterioration or the like is caused by a reduction of the film thickness of the semiconductor insulating layer.

The present invention is not limited to the aforementioned embodiments but the present invention can manufacture many semiconductor apparatuses collectively by forming semiconductor apparatuses in a wafer state in which many devices or the like are formed and then separating the wafer into individual semiconductor apparatuses in a separation step.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor apparatus comprising:
a semiconductor substrate which is a single crystal silicon semiconductor substrate, having a first principal surface on which an electric circuit is formed and a second principal surface opposed to the first principal surface, and a through hole that penetrates the first principal surface and the second principal surface and has a taper shape in which an opening on the second principal surface is greater than a through hole opening on the first principal surface, the through hole being formed by anisotropic wet etching;
a multilayered wiring layer formed on the first principal surface having a plurality of conductive wiring layers connected to the electric circuit and a plurality of inter-layer insulating layers having an insulating layer opening of a same size and at a same position as the through hole opening which is an opening of the through hole on the first principal surface;
an electrode pad that covers the insulating layer opening connected to the conductive wiring layer; and
a lead-out wiring layer having a through wiring layer connected to the electrode pad formed inside the through hole and a connection wiring layer formed on the second principal surface side integral with the through wiring layer;
wherein there is no difference in level in a portion of the single crystal silicon semiconductor substrate where the through hole opening contacts the insulating layer opening.

2. The semiconductor apparatus according to claim 1, wherein a thickness of the multilayered wiring layer exceeds 1 μm.

3. The semiconductor apparatus according to claim 2, wherein the through hole of the single crystal silicon semiconductor substrate has an angle of inclination of a wall surface of 54.7 degrees.

4. A method of manufacturing a semiconductor apparatus comprising:
a device substrate preparation step of preparing a device substrate comprising a semiconductor substrate which is a single crystal silicon semiconductor substrate, having a first principal surface on which an electric circuit is formed and a second principal surface opposed to the first principal surface, a plurality of conductive wiring layers connected to the electric circuit, a multilayered wiring layer on the first principal surface having a plurality of inter-layer insulating layers and electrode pads on the inter-layer insulating layers connected to the conductive wiring layers;
a through hole formation step of anisotropic wet etching the semiconductor substrate from the second principal surface side and forming a through hole having a through hole opening which is smaller than the electrode pad, at a position opposed to the electrode pad, the through hole having a taper shape in which an opening on the second principal surface is greater than the through hole opening on the first principal surface; and
an inter-layer insulating layer etching step of etching the plurality of inter-layer insulating layers from the second principal surface side using an inner wall of the through hole itself in the single crystal silicon semiconductor substrate as an etch mask and forming an insulating layer opening at a same position as the through hole opening, there being no difference in level in a portion of the single crystal silicon semiconductor substrate where the through hole opening contacts the insulating layer opening.

5. The method of manufacturing a semiconductor apparatus according to claim 4, wherein the through hole of the single crystal silicon semiconductor substrate has an angle of inclination of the wall surface of 54.7 degrees, and a thickness of the multilayered wiring layer exceeds 1 μm.

6. The method of manufacturing a semiconductor apparatus according to claim 5, further comprising:
a second insulating layer formation step of forming a second insulating layer on the inner wall of the through hole and the second principal surface after the inter-layer insulating layer etching step; and
a lead-out wiring layer formation step of forming a through wiring layer connected to the electrode pad on the second insulating layer in the through hole integral with a connection wiring layer connected to the through wiring layer on the second insulating layer of the second principal surface.

7. The method of manufacturing a semiconductor apparatus according to claim 6, wherein the etching in the inter-layer insulating layer etching step is anisotropic etching for forming the insulating layer opening of the same size as the through hole opening.

8. The method of manufacturing a semiconductor apparatus according to claim 7, wherein the etching in the inter-layer insulating layer etching step is dry etching.

9. A method of manufacturing a semiconductor apparatus comprising:
a device substrate preparation step of preparing a device substrate comprising a single crystal silicon semiconductor substrate having a first principal surface on which an electric circuit is formed and a second principal surface opposed to the first principal surface, a multilayered wiring layer having a thickness of 3 μm or more and 50 μm or less on the first principal surface having a plurality of conductive wiring layers connected to the electric circuit and a plurality of inter-layer insulating layers and electrode pads on the inter-layer insulating layers connected to the conductive wiring layers;
a through hole formation step of anisotropic wet etching the single crystal silicon semiconductor substrate from the second principal surface side and forming a taper-shaped through hole having a smaller through hole opening than the electrode pad at a position opposed to the electrode pad, an opening of the second principal surface being greater than the through hole opening;
an inter-layer insulating layer etching step of applying anisotropic dry etching using a CF-based gas to the plurality of inter-layer insulating layers from the second principal surface side using the single crystal silicon semiconductor substrate itself in which the through hole is formed as an etch mask and forming an insulating layer opening of a same size and at a same position as the though hole opening, there being no difference in level in a portion of the single crystal silicon semiconductor substrate where the through hole opening contacts the insulating layer opening;
a second insulating layer formation step of forming a second insulating layer which is an insulating film on the inner wall of the through hole and the second principal surface from the second principal surface side;
a lead-out wiring layer formation step of forming, after removing the second insulating layer on the electrode pad, a lead-out wiring layer comprising a though wiring layer connected to the electrode pad on the second insulating layer in the through hole and a connection wiring layer connected to the through wiring layer on the second insulating layer of the second principal surface;

a protective film formation step of covering the second principal surface with a protective film having a bump opening in a bump formation region of the connection wiring layer; and a bump formation step of forming a bump in the bump formation region.

10. The method of manufacturing a semiconductor apparatus according to claim 9, wherein the through hole of the single crystal silicon semiconductor substrate has an angle of inclination of a wall surface of 54.7 degrees.

* * * * *